US010386907B2

(12) United States Patent
Ammu et al.

(10) Patent No.: US 10,386,907 B2
(45) Date of Patent: *Aug. 20, 2019

(54) BACKUP POWER ARCHITECTURE FOR RACK SYSTEM

(71) Applicant: Google LLC, Mountain View, CA (US)

(72) Inventors: Udaya Kiran Ammu, Santa Clara, CA (US); Tracy Jane Van Dyk, New York, NY (US); Cornelius O'Sullivan, Mountain View, CA (US); Srikanth Lakshmikanthan, Milpitas, CA (US)

(73) Assignee: Google LLC, Mountain View, CA (US)

( * ) Notice: Subject to any disclaimer, the term of this patent is extended or adjusted under 35 U.S.C. 154(b) by 44 days.

This patent is subject to a terminal disclaimer.

(21) Appl. No.: 15/718,546

(22) Filed: Sep. 28, 2017

(65) Prior Publication Data

US 2018/0018008 A1  Jan. 18, 2018

Related U.S. Application Data

(63) Continuation of application No. 13/705,609, filed on Dec. 5, 2012, now Pat. No. 9,804,654.

(51) Int. Cl.
*G06F 1/26* (2006.01)
*G06F 1/30* (2006.01)
(Continued)

(52) U.S. Cl.
CPC ............. *G06F 1/30* (2013.01); *H02J 9/061* (2013.01); *H05K 7/1492* (2013.01); *G06F 1/26* (2013.01);
(Continued)

(58) Field of Classification Search
CPC ...... G06F 1/26; G06F 1/30; G06F 1/32; H02J 7/0016; H02J 9/061; H02J 9/062; Y02B 10/72; H05K 7/1492
See application file for complete search history.

(56) References Cited

U.S. PATENT DOCUMENTS 5,804,890 A    9/1998   Kakalec et al.
5,892,893 A    4/1999   Hanf et al.
(Continued)

FOREIGN PATENT DOCUMENTS

CN    102474129 A    5/2012
CN    102652388 A    8/2012
(Continued)

OTHER PUBLICATIONS

International Search Report and Written Opinion for Application No. PCT/US2013/073034 dated Mar. 31, 2014.
(Continued)

*Primary Examiner* — Terrell S Johnson
(74) *Attorney, Agent, or Firm* — Lerner, David, Littenberg, Krumholz & Mentlik, LLP

(57) ABSTRACT

A computing device is associated with a circuit for sharing and distributing backup power. During normal operating conditions, a main bus bar provides power to each computing device in a rack via a main power bus of the corresponding circuit. In the event of an AC power outage, the main power bus is deactivated and a backup power path of the circuit is activated. Backup power is provided to the device from a battery of the circuit via the backup power path. A shared power path is also activated in the circuit such that backup power may be provided from the battery to the main bus bar. By providing backup power to the main bus bar, the other computing devices in the rack that do not have sufficient backup power may receive backup power from the main bus bar until AC power is restored.

20 Claims, 8 Drawing Sheets

(51) Int. Cl.
   *G06F 1/32*   (2019.01)
   *H02J 7/00*   (2006.01)
   *H02J 9/06*   (2006.01)
   *H05K 7/14*   (2006.01)

(52) U.S. Cl.
   CPC ............... *G06F 1/32* (2013.01); *H02J 7/0016* (2013.01); *H02J 9/062* (2013.01); *Y02B 10/72* (2013.01)

(56) References Cited

U.S. PATENT DOCUMENTS

| | | |
|---|---|---|
| 7,560,831 B2 | 7/2009 | Whitted et al. |
| 8,018,094 B1 | 9/2011 | Jai et al. |
| 9,804,654 B2 * | 10/2017 | Ammu .................... G06F 1/30 |
| 2005/0177756 A1 | 8/2005 | Dobbs et al. |
| 2005/0180079 A1 | 8/2005 | Gaudreau et al. |
| 2006/0043792 A1 | 3/2006 | Hjort et al. |
| 2006/0056142 A1 | 3/2006 | Takahashi et al. |
| 2007/0047100 A1 | 3/2007 | Takahashi et al. |
| 2007/0217125 A1 | 9/2007 | Johnson |
| 2007/0278860 A1 | 12/2007 | Krieger et al. |
| 2010/0299548 A1 | 11/2010 | Chadirchi et al. |
| 2011/0096522 A1 | 4/2011 | Humphrey et al. |
| 2011/0187197 A1 | 8/2011 | Moth |
| 2011/0304211 A1 | 12/2011 | Peterson et al. |
| 2012/0098343 A1 | 4/2012 | Harris et al. |
| 2013/0198534 A1 | 8/2013 | Bailey et al. |
| 2013/0257153 A1 | 10/2013 | Krenz et al. |

FOREIGN PATENT DOCUMENTS

| | | |
|---|---|---|
| WO | 2008019270 A2 | 2/2008 |
| WO | 2009012451 A2 | 1/2009 |
| WO | 2012057729 A1 | 5/2012 |

OTHER PUBLICATIONS

Notification of the First Office Action for Chinese Patent Application No. 201380063615.2, dated Nov. 2, 2016.

Extended European Search Report for European Patent Application No. 13860770.0, dated Dec. 5, 2016.

* cited by examiner

BACKUP POWER ARCHITECTURE FOR RACK SYSTEM

CROSS-REFERENCES TO RELATED APPLICATIONS

The present application is a continuation of U.S. patent application Ser. No. 13/705,609, filed on Dec. 5, 2012, the disclosure of which is hereby incorporated herein by reference.

BACKGROUND

Corporations operating large-scale computing systems invest significant amounts of capital to establish and maintain the hardware necessary to house the computing systems. For example, some computing systems may include a plurality of racks for holding computing devices such as hard drives or entire servers. These racks are typically very expensive to purchase and come in a few standardized sizes. Each rack or group of racks are typically provided with a backup power architecture to supply power to the computing devices in the event of an AC power failure. The backup power architecture may include a group of batteries provided in the same location which may compromise power sharing efficiency.

SUMMARY

The disclosure is directed to a rack system having a backup power architecture that distributes and shares backup power among rack components. A circuit for sharing and distributing backup power is associated with a computing device included in the rack. AC power is input to the rack and converted to DC power by rectifiers. The DC power is provided to each computing device via a main bus bar of the rack. Backup power is not only connected to an input of the computing device, but also to the main bus bar. In response to detection of an AC power outage, a DC backup power path is activated to provide power to the computing device. The power outage also activates a shared power path such that power from the backup battery may also be provided to the main bus bar of the rack. By providing power to the main bus bar from the backup battery during the power outage, other computing devices in the rack that do not have sufficient backup power may receive power from the main bus bar until AC power is restored to the rack.

In one aspect, a circuit for providing backup power includes a main power bus coupled to a main bus bar of a computing system rack and coupled to a computing device. The computing device is provided with power from the main bus bar via the main power bus when AC power is provided to the rack. The circuit also includes a battery, a backup power path coupled to the battery and the computing device, a shared power path coupled to the backup power path and the main bus bar of the rack, and a controller. In response to detection of an AC power outage, the shared power path is activated, and the controller activates the backup power path and deactivates the main power bus such that the battery provides power to the computing device via the backup power path. The power is provided from the battery to the main bus bar of the rack via the backup power path and the shared power path.

In another aspect, a system for providing backup power includes a main power bus coupled to a main bus bar of a computing system rack and coupled to a computing device. The computing device is provided with power from the main bus bar via the main power bus when AC power is provided to the rack. The system also includes a battery, a backup power path coupled to the battery and the computing device, a shared power path coupled to the backup power path and the main bus bar of the rack, and a controller configured to detect an AC power outage. In response to detection of an AC power outage, the controller is configured to activate the backup power path and deactivate the main power bus such that the battery provides power to the computing device via the backup power path. The shared power path is activated in response to the detection of the AC power outage such that power is provided from the battery to the main bus bar of the rack via the backup power path and the shared power path.

In another aspect, a rack assembly includes a rack with shelves for receiving one or more computing devices, a main bus bar, and a backup power circuit associated with a first computing device and coupled to the main bus bar. The backup power circuit includes a main power bus coupled to the main bus bar and coupled to the first computing device. The first computing device is provided with power from the main bus bar via the main power bus when AC power is provided to the rack. The backup power circuit also includes a battery, a backup power path coupled to the battery and the first computing device, a shared power path coupled to the backup power path and the main bus bar, and a controller. In response to detection of an AC power outage, the shared power path are activated, and the controller activates the backup power path and deactivates the main power bus such that the battery provides power to the first computing device via the backup power path and the battery provides power to the main bus bar via the backup power path and the shared power path. Power is also provided to a second computing device via the main bus bar.

DETAILED DESCRIPTION

Figure 1A:
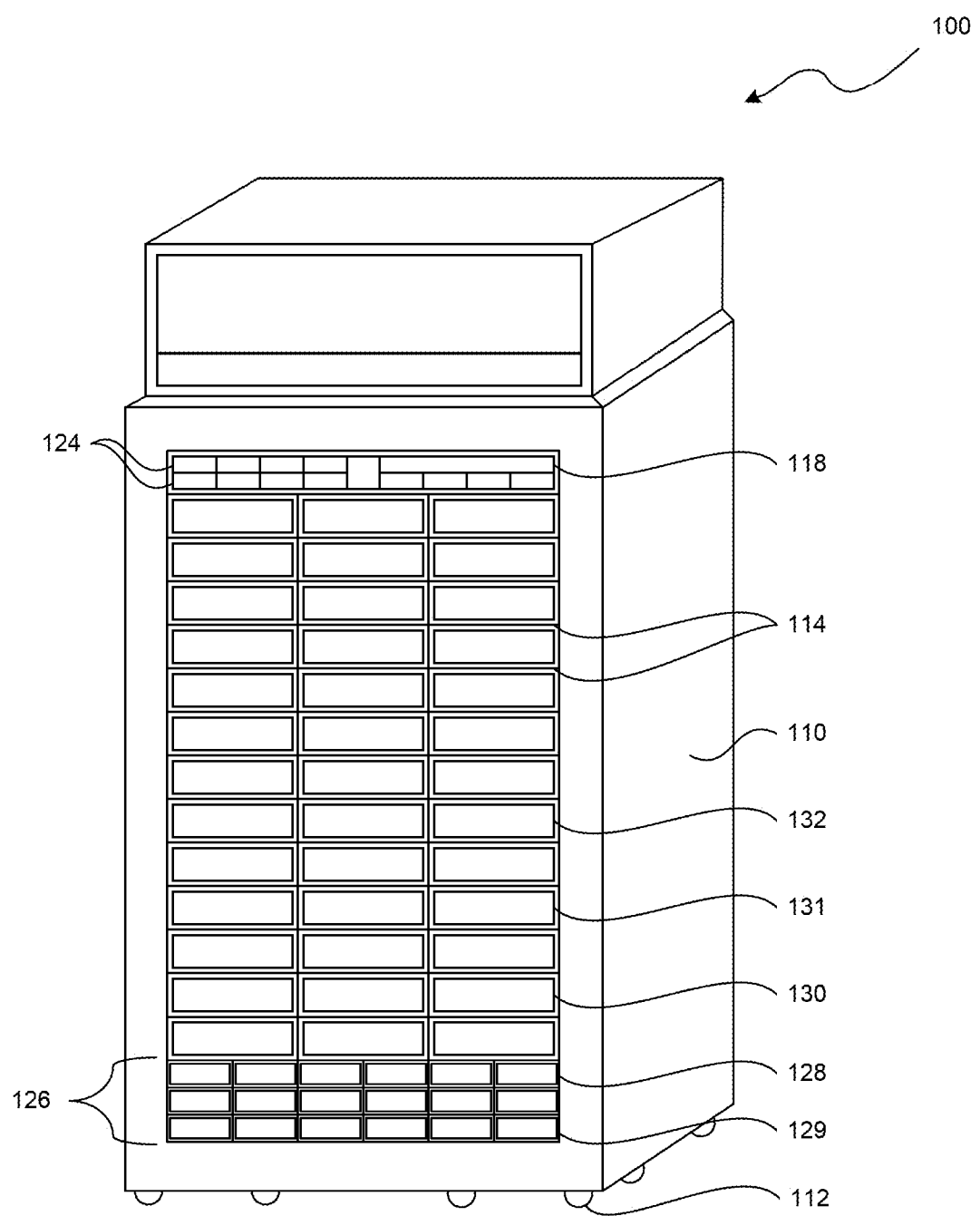
FIGS. 1A-1B are example diagrams of rack architectures in accordance with aspects of the disclosure.
Figure 1B:
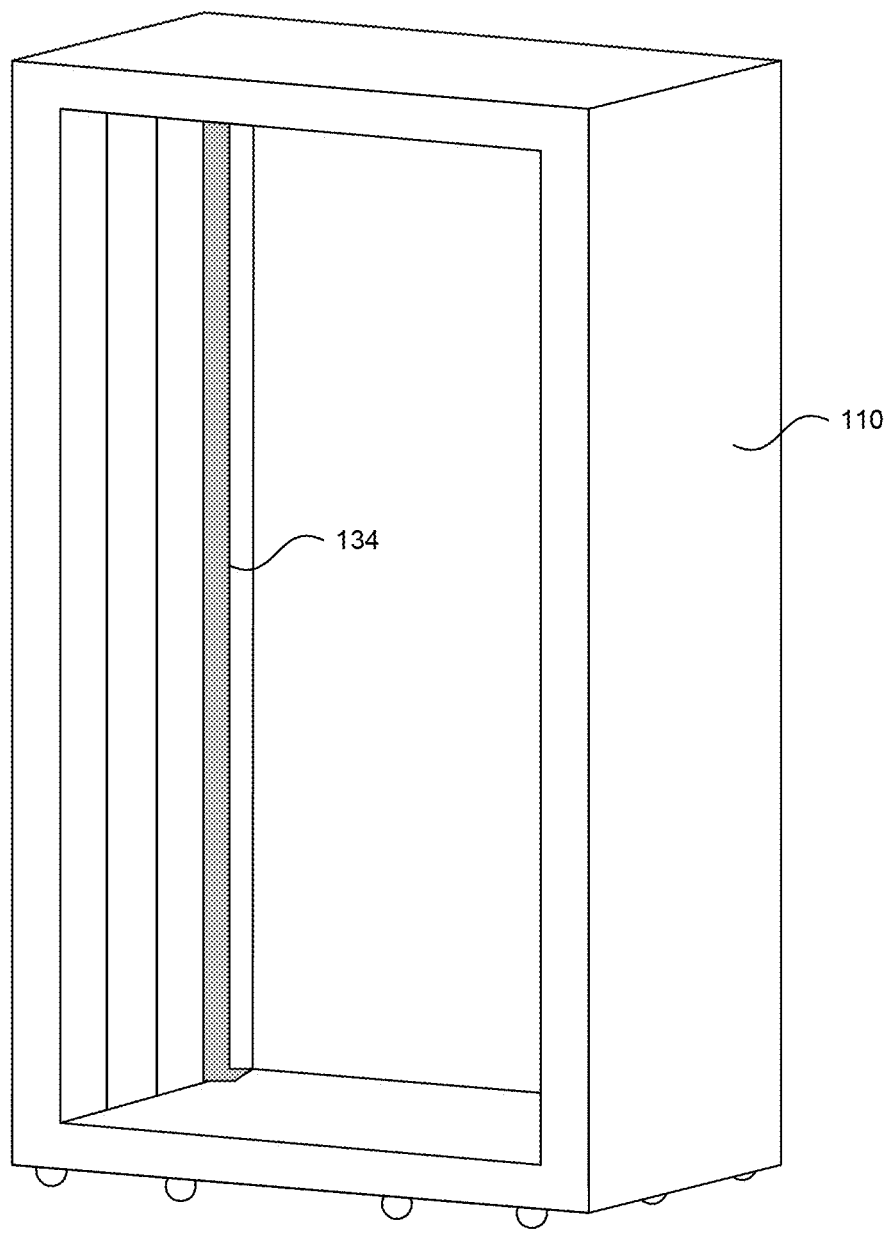

FIGS. 1A and 1B are examples of a mobile rack system. FIG. 1A depicts a server system 100 that may include a mobile rack 110 having wheels 112, a plurality of shelves 114 for holding components, a rack monitoring unit (RMU) 118 for monitoring the status of the features of the rack, a plurality of rectifiers 124, a battery supply 126, battery boxes 128, 129, and a plurality of computing components 130-132. FIG. 1B is an example of the rack 110 of FIG. 1A without shelves 114. In FIG. 1B, it can be seen that the rack 100 includes a main bus bar 134.

The server system 100 supplies power from a power source to the computing components. For example, though not shown in the figures, each of the shelves of the rack may be connected to a power supply such, as an AC or DC power source, by way of main bus bar 134. The main bus bar 134 may also be connected to each shelf of the rack in order to provide power and data to the components or battery boxes.

Figure 2:
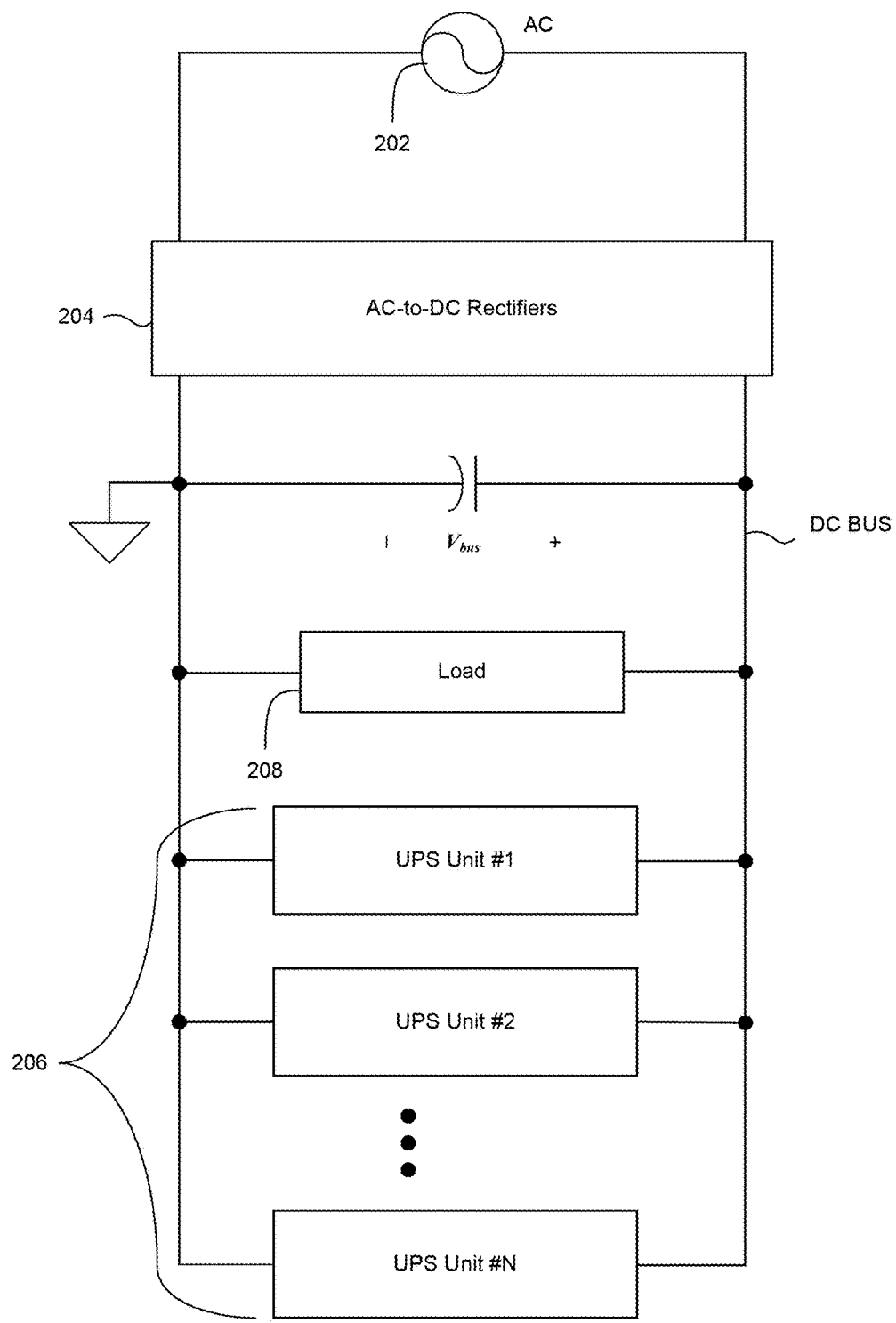
FIG. 2 is an example diagram of power architecture in accordance with aspects of the disclosure.

FIG. 2 is an example of a power architecture for the server system 100. An AC power source 202 may be connected to the rectifiers 124. In this example, the rectifiers 124 may include 48 volt AC-to-DC rectifiers 204. The rectifiers 204 are connected to the main bus bar 134 and supply power to a load 208 (including components 130-132 of FIG. 1A). The load 208 may be connected in parallel to a plurality of uninterruptible power supply (UPS) units 206 (e.g., battery boxes 128, 129 of FIG. 1A), which make up the battery supply 126.

As described above, the load 208 may include a plurality of components. Returning to FIG. 1A, the shelves 114 of rack 110 may receive components 130-132. In one example, component 130 may be a dedicated storage device, for example, including any type of memory capable of storing information accessible by a processor, such as a hard-drive, memory card, ROM, RAM, DVD, CD-ROM, or solid state memory. In another example, component 131 may be a preprogrammed load which draws power from the main bus bar 134 in order to test the operation of the system 100.

Figure 3A:
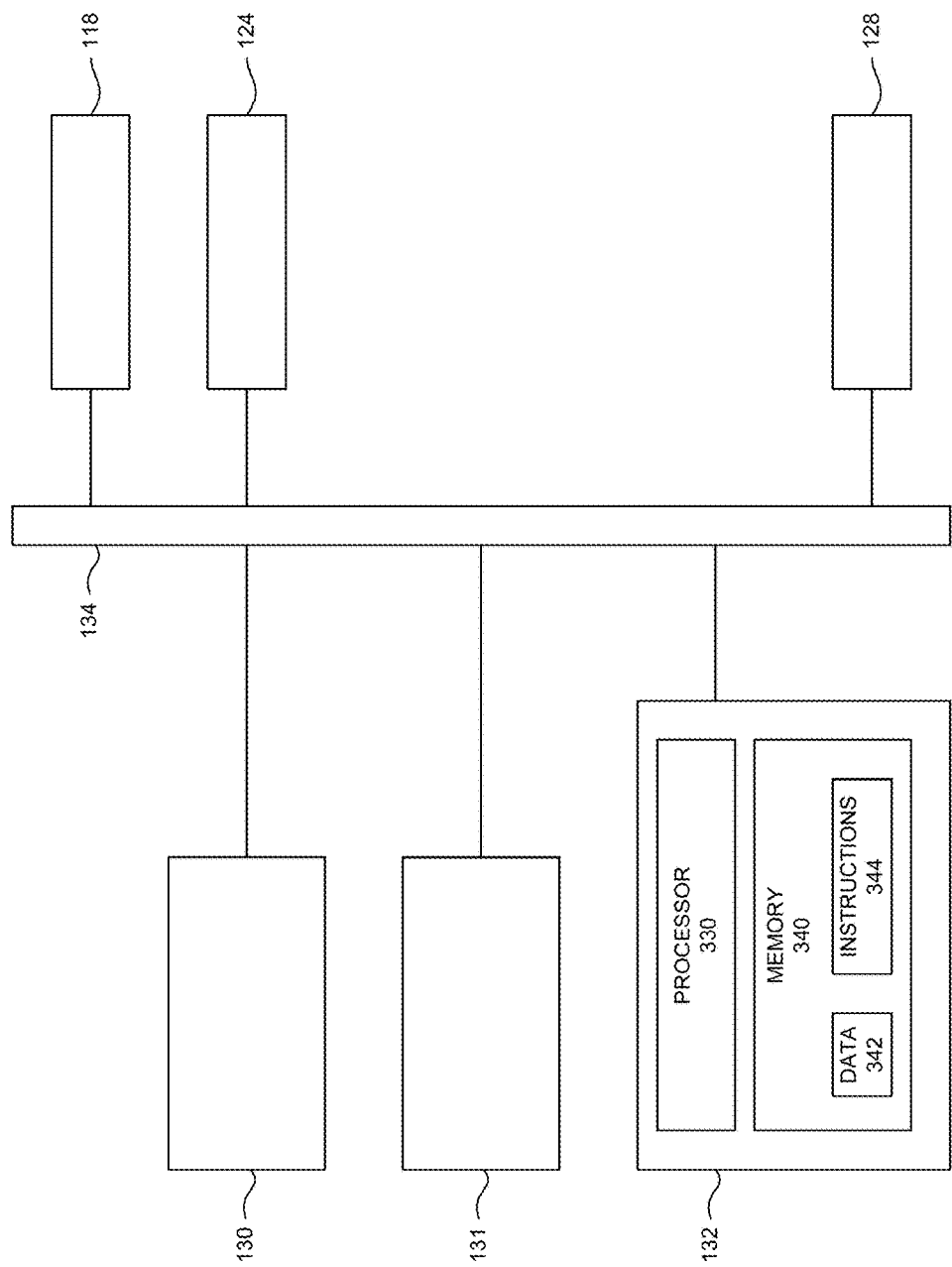
FIGS. 3A-3B are system diagrams of example components.

In yet another example, shown in FIG. 3A, component 132 may be a computer including a processor 330, memory 340 and other components typically present in general purpose computers. In a further example, component 130 or 131 may include a computer configured similarly to computer 132, having a processor, memory, and instructions, or may be a dedicated memory. In this regard, rack 110 and components 130-132, may actually comprise part or all of a load balanced server array 350 of FIG. 3B.

The server array 350 may be at one node of a network 380 and may be capable of directly and indirectly communicating with other nodes of the network 380. For example, the server array 350 may exchange information with different nodes of the network 380 for the purpose of receiving, processing and transmitting data to one or more client devices 390-92 via network 380. In this regard, the server array 350 may transmit information for display to user 395 on a display of the client device 390. The client devices 390-392 may be at different nodes of the network than any of the computers, memories, and other devices comprising the server array 350.

Figure 3B:
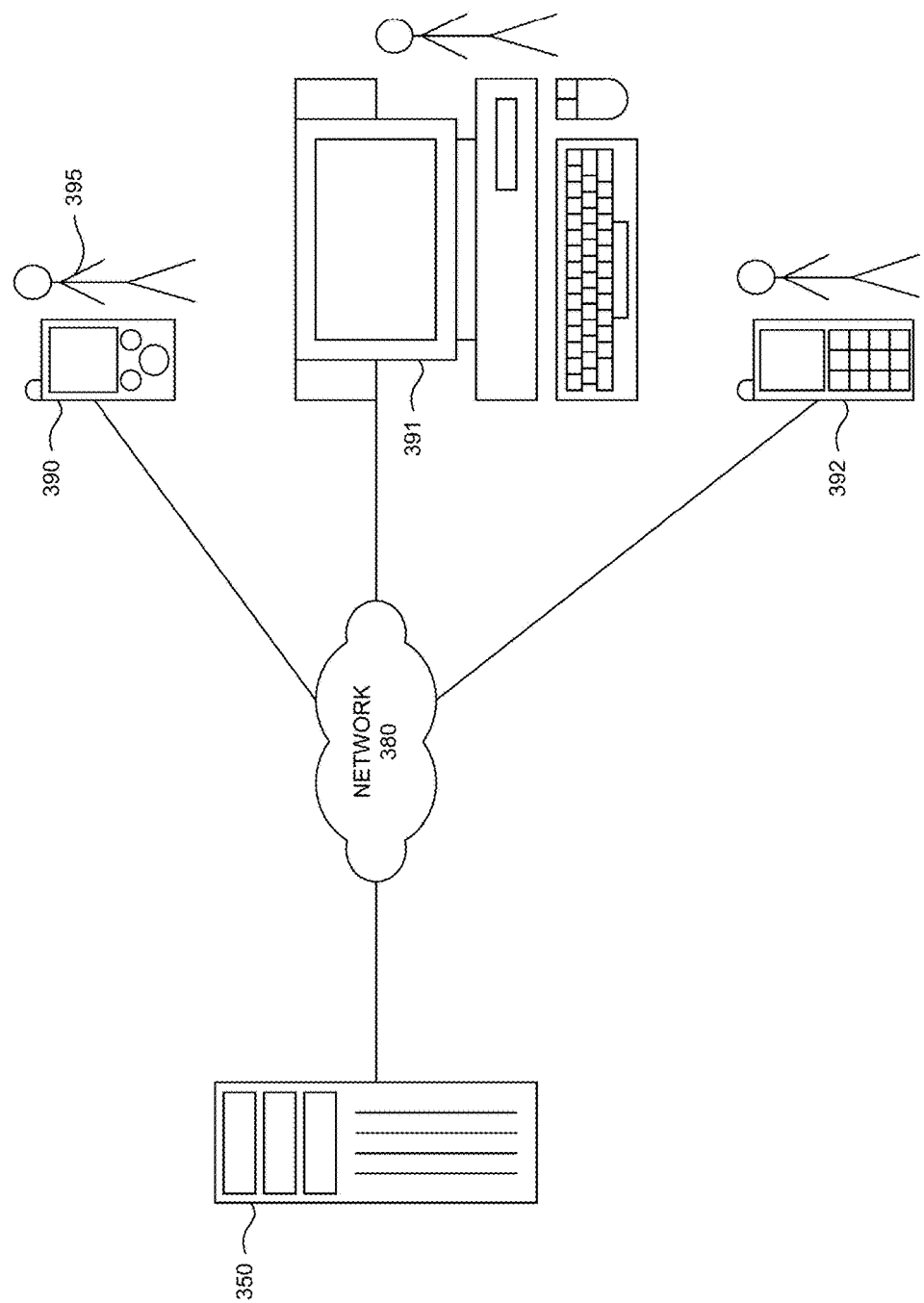

The server array 350 and client devices 390-32 are capable of direct and indirect communication, such as over the network 380. Although only a few computers are depicted in FIG. 3B, it should be appreciated that a typical system can include a large number of connected computers, with each different computer being at a different node of the network 380. The network 390, and intervening nodes, may comprise various conditions and protocols including the Internet, World Wide Web, intranets, virtual private networks, wide area networks, local networks, private networks using communication protocols proprietary to one or more companies, Ethernet, WiFi (such as 802.11, 802.11b, g, n, or other such standards), and HTTP, and various combinations of the foregoing. Such communication may be facilitated by any device capable of transmitting data to and from other computers, such as modems (e.g., dial-up, cable or fiber optic) and wireless interfaces.

Figure 4:
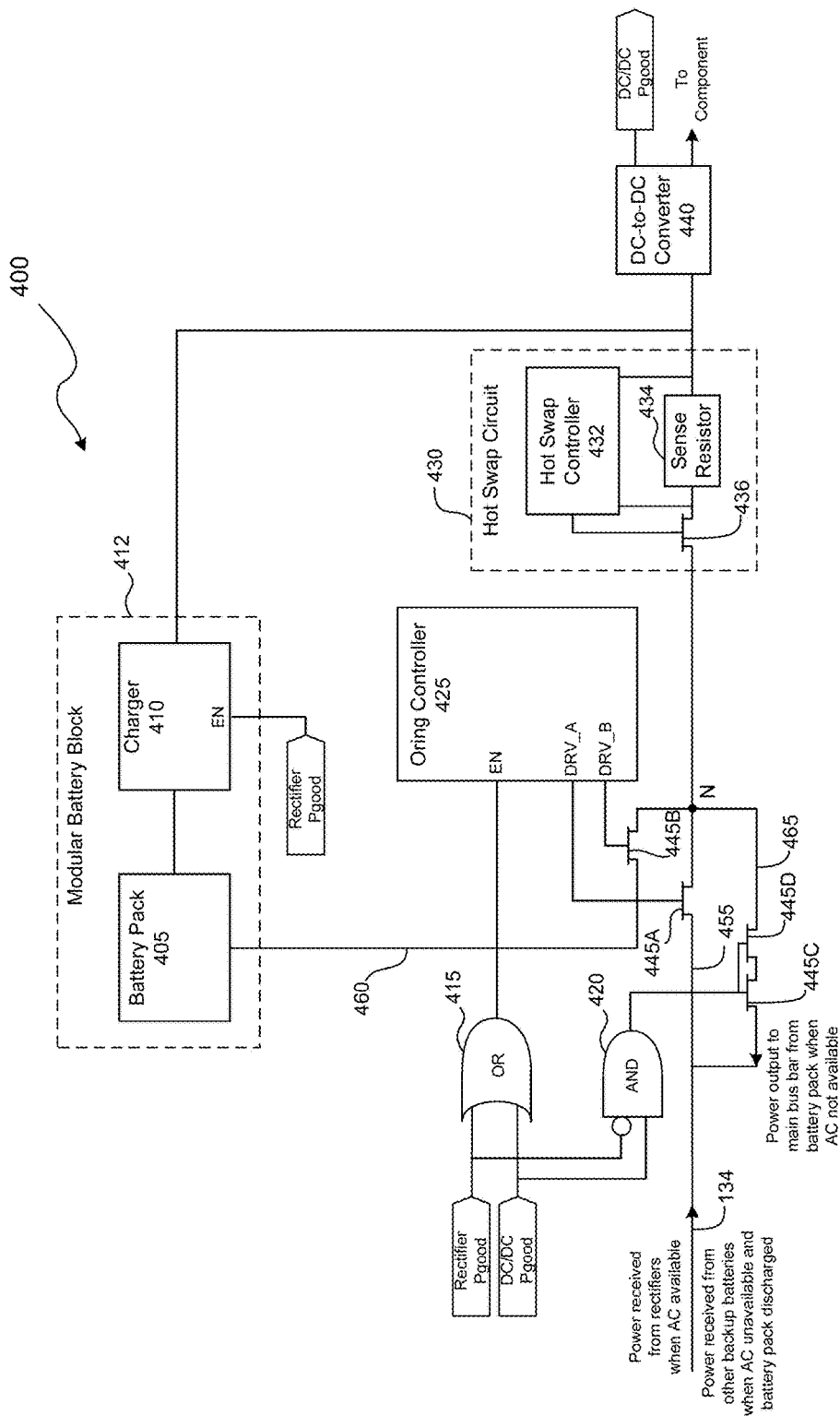
FIG. 4 is a schematic diagram in accordance with an implementation.
Figure 5:
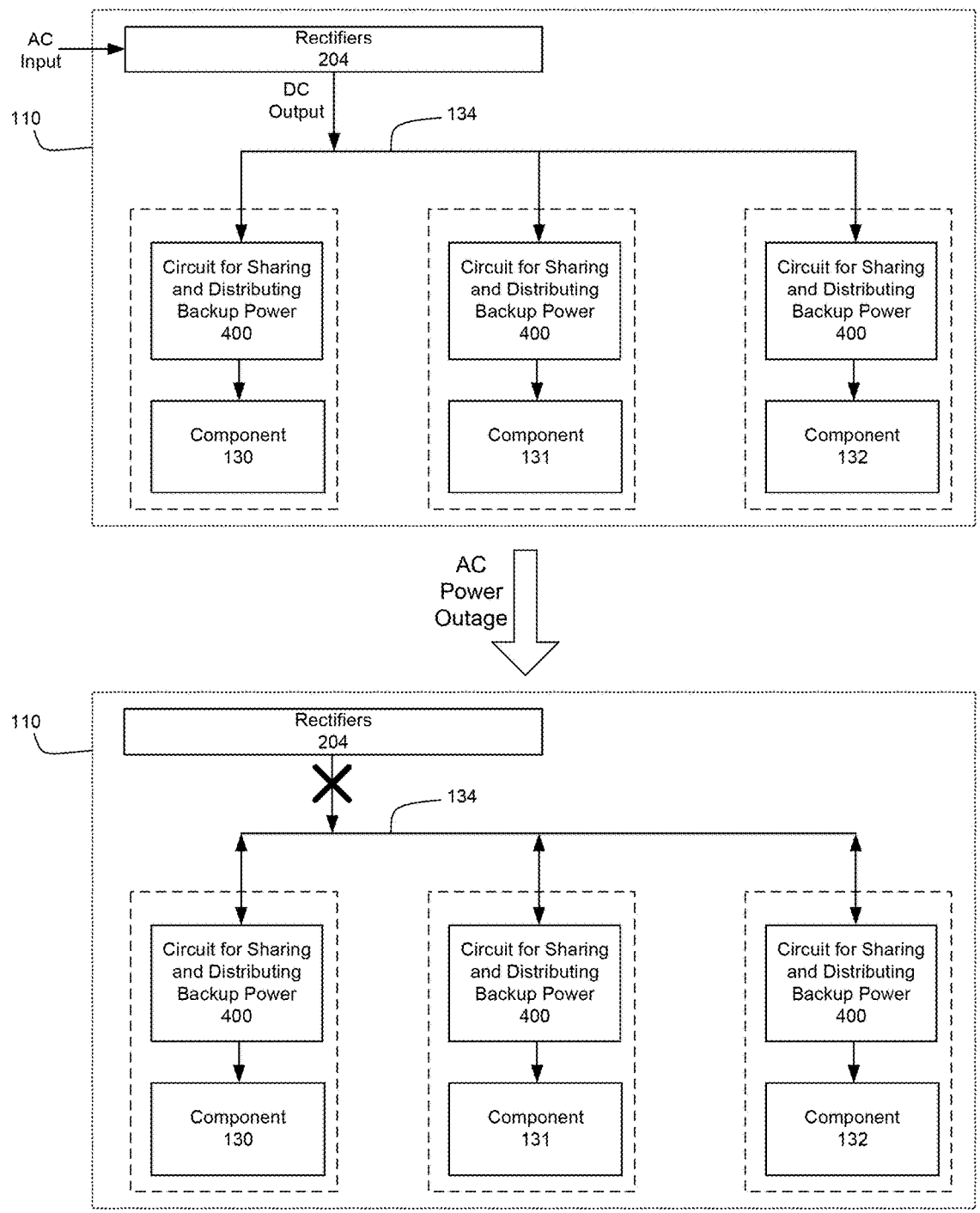
FIG. 5 is a functional block diagram in accordance with an implementation.

FIG. 4 illustrates a circuit 400 for providing backup power to components in a rack system in accordance with some implementations. FIG. 5 illustrates a system of components provided in a rack as described above with reference to FIGS. 1A, 1B, 2 and 3A.

The circuit 400 includes a battery pack 405, a charger 410, a logic OR gate 415, a logic AND gate 420, an "oring" controller 425, a hot swap circuit 430, a DC-to-DC converter 440, and four switches 445A, 445B, 445C, 445D. In some implementations, the switches 445A, 445B, 445C, 445D may be high current MOSFETs.

The hot swap circuit 430 includes a hot swap controller 432, a sense resistor 434 and a switch 436. The hot swap circuit 430 is provided on a power bus between the DC-to-DC converter 440 and a node N. The hot swap circuit 430 controls or optimizes power delivery by protecting the circuit 400 from unwanted inrush current, reverse current flow and other potential short-circuit events. The hot swap circuit 430 is particularly useful in preventing damage and operational faults in applications where a line card is to be inserted in a live backplane. In other words, the hot swap circuit 430 provides inrush current limiting for the circuit 400 when a removable card on which the circuit 400 is provided is inserted into one of the components 130-132 in the rack 110. The hot swap circuit 430 also provides the circuit 400 with short-circuit protection when the circuit 400 is in operation.

Power from the rectifiers 204 is provided to a main power bus 455 via the main bus bar 134 of the rack 110 when AC power is available to the rack 110. Under these conditions, a "Rectifier Pgood" signal is at a "true" level, which indicates that the rectifiers 204 are operating correctly and external power is provided to the circuit 400 from the main bus bar 134. The switch 445A is provided on the main power bus 455 between the main bus bar 134 of the rack 110 and the node N, and the switches 445C, 445D are provided in series on a shared power path 465 in parallel with the switch 445A between the main bus bar 134 and the node N.

The battery pack 405 is coupled to the charger 410. Both the battery pack 405 and the charger 410 may be provided together in a modular battery block 412. An output of the hot swap circuit 430 provides power to both the DC-to-DC converter 440 and the charger 410. The charger 410 receives the Rectifier Pgood signal as an enabling signal. The Rectifier Pgood signal enables the charger 410 to charge the battery pack 405 when power is available to the circuit 400 from the rectifiers 204, e.g., when the Rectifier Pgood signal is at a "true" level. Power may not be provided to the circuit 400 from the rectifiers 204 due to an AC power outage. In this case, the Rectifier Pgood changes to a "false" level which disables the charger 410. The disabled charger 410 does not charge the battery pack 405. When external power is unavailable, the battery pack 405 outputs power to a backup power path 460. The switch 445B is provided on the backup power path 460 between the battery pack 405 and the node N.

The oring controller 425 monitors the main power bus 455 and the backup power path 460. When the oring contoller 425 detects a higher voltage level on the main power bus 455 relative to the backup power path 460, the switch 445A is activated and the switch 445B is deactivated. The main power bus 455 is at a higher voltage level than the backup power path 460 when power is provided to the circuit 400 from the rectifiers 204, e.g., when Rectifier Pgood is at a "true" level. When the switch 445A is activated, the DC-to-DC converter 440 is activated via power provided from the main power bus 455 and through the hot swap circuit 430. The power output from the DC-to-DC converter 440 is then provided to the component associated with the circuit 400. For purposes of this description, the circuit 400 will be associated with component 130. The activated DC-to-DC converter 440 causes the DC/DC Pgood signal to be at a "true" level. In some implementations, the function of the switches 445A, 445C, 445D may be performed by the oring controller 425 after a modification to the oring controller 425, thereby eliminating the need for the switches 445A, 445C, 445D in the circuit 400.

The Rectifier Pgood signal and the DC/DC Pgood signal are both provided as inputs to the logic OR gate 415. The output of the logic OR gate 415 is provided to the oring controller 425. The oring controller 425 is enabled based on the output of the logic OR gate 415, e.g., when either the Rectifier Pgood signal or the DC/DC Pgood signal is at a "true" level.

The logic AND gate 420 receives as inputs the DC/DC Pgood signal and an inverse of the Rectifier Pgood signal. The output of the logic AND gate 420 is provided to the switches 445C, 445D such that the switches 445C, 445D are activated when the output of the logic AND gate 420 is at a "true" level, e.g., when the Rectifier Pgood signal is a "false" level and the DC/DC Pgood signal is at a "true" level. The switches 445C, 445D are deactivated when the output of the logic AND gate 420 is at a "false" level such that power flow is prevented in either direction along the shared power path 465.

In the event that an AC power outage occurs, the rectifiers 204 no longer provide power to the main power bus 455 via the main bus bar 134. The power outage causes Rectifier Pgood to change to a "false" level. The loss of power provided from the main bus bar 134 may cause the voltage level at the main power bus 455 to drop below a voltage level provided at the backup power path 460. The oring controller 425 detects that the voltage level at the backup power path 460 is greater than the voltage level at the main power bus 455. In response to the detected drop in voltage at the main power bus 455, the oring controller 425 activates the switch 445B and deactivates the switch 445A.

The activation of the switch 445B causes the power from the battery pack 405 to be provided to the component 130 associated with the circuit 400 via the backup power path 460 and the DC-to-DC converter 440. Since the DC-to-DC converter 440 remains activated due to sufficient power provided to the DC-to-DC converter 440 from the battery pack 405, the DC/DC Pgood signal remains at a "true" level.

The activation of the switches 445C, 445D causes the power from the battery pack 405 to also be provided to the shared power path 465 via the backup power path 460. The power from the backup power path 460 is provided to the main bus bar 134 to provide power to the other components 131, 132 in the rack 110. In the event of backup failure in either component 131, 132, corresponding switches 445A, 445C, 445D are activated to provide power to the circuit 400 and share power to the component lacking backup power.

The battery pack 405 continues to provide power to the component 130 associated with the circuit 400 and the main bus bar 134 until AC power is restored and the rectifiers 204 begin operating again to provide power to the circuit 400. If AC power is not restored to the rectifiers 204 in a timely manner, the battery pack 405 may discharge to a voltage level that deactivates the DC-to-DC converter 440 causing the DC/DC Pgood signal to change to a "false" level. The "false" DC/DC Pgood signal causes the switch 445C to deactivate thereby preventing the battery pack 405 from providing power to the main bus bar 134 via the shared path 465.

Table I is a logic diagram that indicates the states of the oring controller 425, the charger 410 and the shared bus path 465 relative to the states of the Rectifier Pgood signal and the DC/DC Pgood signal. "X" indicates a "don't care" condition, "T" indicates a "true" signal level, "F" indicates a "false" signal level, "Y" indicates "yes", and "N indicates "no".

TABLE I

| Rectifier Pgood | DC/DC Pgood | O-Ring Controller Enabled? | Charger Activated? | Shared Power Path Enabled? |
|---|---|---|---|---|
| T | X | Y | Y | N |
| F | T | Y | N | Y |

A significant discharge of the battery pack 405, e.g., a voltage at the main power path 455 being higher than one volt above a voltage at the backup power path 460, may cause the oring controller 425 to detect a higher voltage level at the main power bus 455. In response to the higher voltage detected at the main power bus 455, the oring controller 425 may activate the switch 445A and deactivate the switch 445B. Under these conditions, the main bus bar 455 may receive power from circuits associated with the other components 131, 132 in the rack 110 or from the battery supply 126 via the main bus bar 134. The circuits associated with the other components 131, 132 may have battery packs that have not yet discharged to a level that prevents power from being provided to the main bus bar 134 via the shared power paths in the circuits associated with the components 131, 132.

Referring to FIG. 5, the rectifiers 204 in a rack 110 receive AC power from an external source during normal operating conditions. The rectifiers 204 convert the AC power to DC power and output the DC power to the main bus bar 134. The main bus bar 134 distributes the DC power to components 130, 131, 132 via the circuit 400 associated with each component.

In the event of a power outage, DC power is not output from the rectifiers 204. The backup battery of each circuit 400 provides power to the corresponding component 130, 131, 132. DC power may also be provided by the battery of the circuit 400 to the main bus bar 134 such that other components coupled to the main bus bar 134 may be provided with backup power even though a backup battery associated with that component is discharged.

Figure 6:
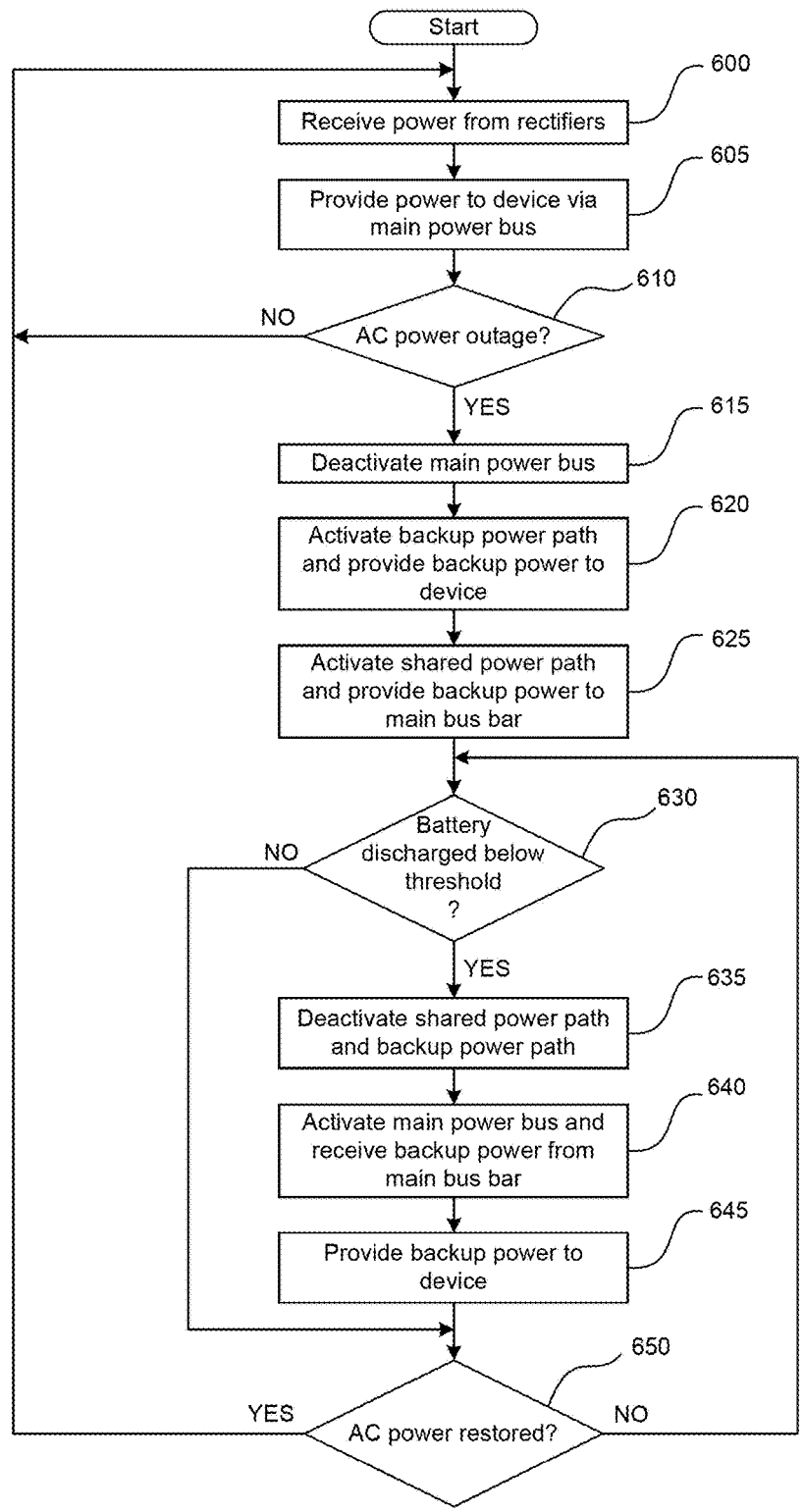
FIG. 6 is an example flow diagram in accordance with an implementation.

FIG. 6 is an example flow diagram illustrating a method for providing backup power to computing devices assembled in a rack in accordance with an implementation. The method may be performed by a circuit that is associated with a computing device. The computing devices and corresponding circuits for providing backup power may be provided in the rack. The rack typically includes rectifiers that receive AC power from an external source and convert the AC power to DC power. The DC power is then provided from the rectifiers to a main bus bar of the rack. Each computing device is coupled to the main bus bar to receive the DC power for operating the device. Processing begins when DC power is received at the circuit from the rectifiers in the rack via the main bus bar (block 600).

Power is provided from the main bus bar to the computing device via a main power bus in the circuit (block 605). A controller of the circuit monitors the main power bus and a backup power path. In the event that the main power bus is at a higher voltage level than the backup power path, the controller activates the main power bus and deactivates the backup power path. The main power bus is typically at a higher voltage level than the backup power path when AC power is provided to the rectifiers and sufficient DC power is provided to the circuit via the main bus bar. The main power bus is commonly at a lower voltage level than the backup power path during an AC power outage.

A determination is made whether an AC power outage has occurred (block 610). An AC power outage may occur due to a problem with the local electricity grid caused, for example, by fallen power lines. Other examples of reasons for an AC power outage include a power cord from the rack being disconnected from an AC power outlet, or excessive current consumed by electronic devices connected to the same circuit breaker as the rack. The AC power outage causes the rectifiers to cease outputting DC power. Any charge provided to a battery in the circuit is also ceased in response to detection of the AC power outage. If no AC power outage has occurred, processing returns to block 600; otherwise, processing proceeds to block 615.

The main power bus is deactivated in response to detection of the AC power outage (block 615). The controller may deactivate the main power bus in response to the voltage level at the main power bus decreasing to a value that is less than the voltage level of the backup power path. The voltage level at the backup power path is essentially the same as the voltage level of the backup battery when the AC power outage occurs. The controller may deactivate the main power bus by deactivating a switch, such as a high current MOSFET, provided on the main power bus.

The backup power path is activated and backup power is provided to the computing device associated with the circuit via the backup power path (block 620). The backup power path is activated by the controller when the voltage level at the main power bus drops below the voltage level of the backup power path. The controller may activate the backup power path by activating a switch, such as a high current MOSFET, provided on the backup power path. The computing device may then be powered by the voltage provided from the battery of the circuit.

The shared power path is also activated in response to detection of the AC power outage such that backup power is provided from the battery to the main bus bar of the rack (block 625). Activation of the shared power path may occur by activating a switch, such as a high current MOSFET, provided on the shared power path. The shared power path allows power from the battery to be output to the main bus bar of the rack via the backup power path and the shared power path. Thus, during the AC power outage, the battery provides power to the component to which it is associated via the backup power path and to the other components in the rack via the backup power path and the shared power path.

A determination is made whether the battery that provides the backup power has discharged below a threshold voltage (block 630). The threshold voltage may be set at a value below which the battery cannot provide adequate power to the computing device associated with the circuit. The threshold voltage value is set by the controller. If the battery cannot power the computing device, power may be available from the backup batteries of other circuits associated with other computing devices in the rack, or from a battery supply provided in the rack and that is available to provide power to any computing devices in the rack. If the battery has not discharged below the threshold, processing continues to block 650. If the battery has discharged below the threshold, processing proceeds to block 635.

The shared power path and the backup power path are deactivated in response to the battery discharging to a value below the threshold voltage (block 635). The controller may detect the drop in voltage on the backup power path and, in response, may deactivate the shared power path and the backup power path by deactivating a switch provided on each path. By deactivating the backup power path, power from the battery is no longer provided to the computing device associated with the circuit. In addition, deactivation of the shared power path and the backup power path, prevents power from the battery from being provided to the main bus bar of the rack.

The main power bus is activated by the controller and backup power is received from the main bus bar (block 640). The controller may detect that the voltage level at the backup power path decreases to a value that is less than the voltage level at the main bus bar. In response to the lower voltage level at the backup power path, the controller activates the man power bus by activating a switch provided on the main power bus.

The backup power is provided to the computing device from the main bus bar via the main power bus (block 645). At least some of the other circuits that are associated with the other computing devices in the rack may include backup batteries that have not yet discharged. Accordingly, these batteries provide backup power to the main bus bar of the rack. This backup power may be made available to the main power bus of any of the circuits that has a discharged battery. In some implementations, a battery supply provided in the rack may also provide power to the computing devices via the main bus bar during the AC power outage.

A determination is made whether AC power has been restored (block 650). The AC power may be restored by addressing the cause of the power outage. If AC power is restored, processing moves to block 600. If the AC power outage continues, processing returns to block 630. The computing device may continue to receive backup power from the battery and the circuit may continue to provide backup power to the main bus bar of the rack. In the event that the battery becomes discharged, the computing device may receive backup power from the backup batteries of other circuits associated with other devices in the rack. Backup power will continue to be shared and distributed to the computing devices in the rack until the AC power is restored or until all of the backup batteries in the rack are discharged.

As described above, a backup power architecture is provided for a rack system having multiple components included in a rack. The rack typically provides power from AC-to-DC rectifiers to the components via a main bus bar. During normal operating conditions, the main bus bar provides power to each component via a main power bus of a circuit associated with the component. In the event of a power outage, the main power bus is deactivated and a backup power path of the circuit is activated. Backup power is provided to the component from a battery of the circuit via the backup power path. The power outage also activates a shared power path such that backup power from the battery may also be provided to the main bus bar of the rack. By providing backup power to the main bus bar, other components in the rack that do not have sufficient backup power may receive power from batteries of the other components via the main bus bar until AC power is restored.

As these and other variations and combinations of the features discussed above can be utilized without departing from the subject matter defined by the claims, the foregoing description of the implementations should be taken by way of illustration rather than by way of limitation of the subject matter defined by the claims. It will also be understood that the provision of the examples disclosed herein (as well as clauses phrased as "such as," "including" and the like) should not be interpreted as limiting the claimed subject

The invention claimed is:

1. A circuit for providing backup power, the circuit comprising:
a main power bus coupled to a main bus bar of a system rack and coupled to an electronic component, wherein the electronic component is provided with power from the main bus bar via the main power bus when AC power is provided to the rack;
a backup power path coupled to a battery and the electronic component, the backup power path being distinct from the main power bus, configured for activation and deactivation independent of activation and deactivation of the main power bus, and coupled to the main power bus via a node; and
a shared power path coupled to the backup power path and the main bus bar of the rack,
wherein, in response to detection of an AC power outage, the shared power path is activated based on (i) the status of AC power delivered to the rack and (ii) the status of power received at the electronic component, and the backup power path is activated and the main power bus is deactivated such that the battery provides power to the electronic component via the backup power path, and wherein power is provided from the battery to the main bus bar of the rack via the backup power path and the shared power path such that backup power is provided to the main bus bar without passing through the main power bus.

2. The circuit of claim 1, wherein the main power bus comprises a switch that is deactivated in response to detection of the AC power outage.

3. The circuit of claim 1, wherein the backup power path comprises a switch that is activated in response to detection of the AC power outage.

4. The circuit of claim 1, wherein the shared power path comprises at least one switch that is activated in response to detection of the AC power outage.

5. The circuit of claim 1, further comprising a controller configured to detect the AC power outage.

6. The circuit of claim 5, wherein the controller is configured to monitor the main power bus and the backup power path, the controller detecting the AC power outage when a voltage level at the main power bus is less than a voltage level at the backup power path.

7. The circuit of claim 6, wherein, in the event that the controller detects that the voltage level at the main power bus is greater than the voltage level at the backup power path, the shared power path and the backup power path are deactivated and the main power bus is activated such that the electronic component is provided with backup power from the main bus bar, the backup power being provided to the main bus bar from a different circuit associated with a different electronic component.

8. The circuit of claim 7, wherein the voltage level at the main power bus is greater than the voltage level at the backup power path due to the battery being discharged.

9. A system for providing backup power, the system comprising:
a main power bus coupled to a main bus bar of a system rack and coupled to an electronic component, wherein the electronic component is provided with power from the main bus bar via the main power bus when AC power is provided to the rack;
a backup power path coupled to a battery and the electronic component, the backup power path being distinct from the main power bus, configured for activation and deactivation independent of activation and deactivation of the main power bus, and coupled to the main power bus via a node; and
a shared power path coupled to the backup power path and the main bus bar of the rack,
wherein, in response to detection of an AC power outage, the backup power path is activated and the main power bus is deactivated such that the battery provides power to the electronic component via the backup power path, wherein the shared power path is activated, based on (i) the status of AC power delivered to the rack and (ii) the status of power received at the electronic component, in response to the detection of the AC power outage such that power is provided from the battery to the main bus bar of the rack via the backup power path and the shared power path such that backup power is provided to the main bus bar without passing through the main power bus.

10. The system of claim 9, further comprising a controller configured to monitor the main power bus and the backup power path, and detect the AC power outage when a voltage level at the main power bus is less than a voltage level at the backup power path.

11. The system of claim 10, wherein, in the event that the controller detects that the voltage level at the main power bus is greater than the voltage level at the backup power path, the shared power path and the backup power path are deactivated and the main power bus is activated such that the electronic component is provided with backup power from the main bus bar, the backup power being provided to the main bus bar from a different circuit associated with a different electronic component.

12. The system of claim 11, wherein the voltage level at the main power bus is greater than the voltage level at the backup power path due to the battery being discharged.

13. The system of claim 9, wherein:
the main power bus comprises a first switch that is deactivated in response to detection of the AC power outage,
the backup power path comprises a second switch that is activated in response to detection of the AC power outage, and
the shared power path comprises at least one third switch that is activated in response to detection of the AC power outage.

14. The system of claim 13, wherein each switch is a MOSFET.

15. A rack assembly comprising:
a rack for receiving one or more electronic components;
a main bus bar; and
a backup power circuit associated with a first electronic component and coupled to the main bus bar, the backup power circuit comprising:
a main power bus coupled to the main bus bar and coupled to the first electronic component, wherein the first electronic component is provided with power from the main bus bar via the main power bus when AC power is provided to the rack;
a backup power path coupled to a battery and the first electronic component, the backup power path being distinct from the main power bus, configured for activation and deactivation independent of activation and deactivation of the main power bus, and coupled to the main power bus via a node; and a shared power path coupled to the backup power path and the main bus bar;

wherein, in response to detection of an AC power outage, the shared power path is activated based on (i) the status of AC power delivered to the rack and (ii) the status of power received at the first electronic component, the backup power path is activated, and the main power bus is deactivated such that the battery provides power to the first electronic component via the backup power path and the battery provides power to the main bus bar via the backup power path and the shared power path, wherein power is provided to a second electronic component via the main bus bar such that backup power is provided to the main bus bar without passing through the main power bus.

16. The rack assembly of claim 15, wherein the backup power circuit further comprises a controller configured to detect the AC power outage.

17. The rack assembly of claim 16, wherein the controller is configured to monitor the main power bus and the backup power path, the controller detecting the AC power outage when a voltage level at the main power bus is less than a voltage level at the backup power path.

18. The rack assembly of claim 17, wherein, in the event that the controller detects that the voltage level at the main power bus is greater than the voltage level at the backup power path, the shared power path and the backup power path are deactivated and the main power bus is activated such that the first electronic component is provided with backup power from the main bus bar, the backup power being provided to the main bus bar from a different circuit coupled to the main bus bar and associated with a third electronic component.

19. The rack assembly of claim 18, wherein the voltage level at the main power bus is greater than the voltage level at the backup power path due to the battery being discharged.

20. The rack assembly of claim 15, wherein:
the main power bus comprises a first switch that is deactivated in response to detection of the AC power outage,
the backup power path comprises a second switch that is activated in response to detection of the AC power outage, and
the shared power path comprises at least one third switch that is activated in response to detection of the AC power outage.

* * * * *